(12) United States Patent
Boef et al.

(10) Patent No.: US 7,990,145 B2
(45) Date of Patent: Aug. 2, 2011

(54) DIGITIZED MR SIGNAL DATA ENCODING WITH DYNAMICALLY VARIABLE BIT RATE

(75) Inventors: Johannes Hendrik den Boef, Eindhoven (NL); Filips van Liere, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 243 days.

(21) Appl. No.: 12/439,253

(22) PCT Filed: Aug. 29, 2007

(86) PCT No.: PCT/IB2007/053473
§ 371 (c)(1),
(2), (4) Date: Feb. 27, 2009

(87) PCT Pub. No.: WO2008/026173
PCT Pub. Date: Mar. 6, 2008

(65) Prior Publication Data
US 2010/0021032 A1   Jan. 28, 2010

(30) Foreign Application Priority Data

Aug. 30, 2006 (EP) .................................... 06119767

(51) Int. Cl.
*G01V 3/00* (2006.01)

(52) U.S. Cl. ........................................ 324/318; 324/322

(58) Field of Classification Search .......... 324/300–322; 705/2; 707/4; 382/128–131; 600/300, 407–435, 600/509–513
See application file for complete search history.

(56) References Cited

U.S. PATENT DOCUMENTS

| 4,857,846 | A | 8/1989 | Carlson |
| 7,558,622 | B2* | 7/2009 | Tran .............................. 600/509 |
| 2008/0004904 | A1* | 1/2008 | Tran ................................. 705/2 |
| 2009/0318779 | A1* | 12/2009 | Tran .............................. 600/301 |
| 2010/0021032 | A1* | 1/2010 | Boef et al. .................... 382/131 |

FOREIGN PATENT DOCUMENTS

| WO | 2004089211 A2 | 10/2004 |
| WO | 2005008269 A1 | 1/2005 |
| WO | 2005096016 A1 | 10/2005 |
| WO | 2006048816 A1 | 5/2006 |

OTHER PUBLICATIONS

Banitsas, K. A., et al.; Adjusting DICOM Specifications When Using Wireless LANs: The MedLAN example; 2003; Proc. 25th Ann. Int'l Conf. of IEEE EMBS; vol. 43:661-3664.

Behin, R., et al.; Dynamic Range Requirements for MRI; 2005; Concepts in Magnetic Resonance Part B: Magnetic Resonance Engineering; vol. 26B:28-35.

Cohen, M. S.; A Data Compression Method for Image Time Series; 2001; Human Brain Mapping; 12:20-24.

Wei, J., et al.; Digital Wireless Transmission for MRI; 2006; Proc. Intl. Soc. Mag. Reson. Med.; 14:3542.

Wei, J., et al.; A realization of digital wireless transmission for MRI signals based on 802.11b; 2007; Journal of Magnetic Resonance; 186:358-363.

* cited by examiner

*Primary Examiner* — Melissa Koval
*Assistant Examiner* — Tiffany Fetzner (57) ABSTRACT

A digital receiver circuit includes an encoder (104) for encoding a digitized magnetic resonance signal is disclosed herein. The digitized magnetic resonance signal includes one or more data packets. Each data packet is representative of a portion of a magnetic resonance signal. The encoder (104) is configured to dynamically allocate a number of bits for each data packet based on a characteristic of at least the portion of the magnetic resonance signal represented by the particular data packet.

13 Claims, 7 Drawing Sheets

DIGITIZED MR SIGNAL DATA ENCODING WITH DYNAMICALLY VARIABLE BIT RATE

FIELD OF THE INVENTION

This invention relates to the field of magnetic resonance (MR) imaging, and particularly to encoding of MR signals.

BACKGROUND OF THE INVENTION

The international application WO 2006/048816 A1 discloses an MR device comprising a plurality of receiving units placed in or near an examination zone in a main magnet. Each individual receiving unit comprises a digitizing means for transforming the MR signals into digital signal samples. Each receiving unit is also provided with an appropriate transmitter in order to enable parallel transfer of the digital data without interference between the individual signals.

SUMMARY OF THE INVENTION

With a view to improving the efficiency of transmission of the digital data, a digital receiver circuit comprising an encoder capable of encoding digitized MR signals prior to transmission is hereby disclosed in this application. A corresponding method of encoding the digitized MR signals, as well as an MR system utilizing such a digital receiver circuit and a computer program comprising instructions to enable such a digital receiver circuit to encode digitized MR signals, is also disclosed herein.

Improved efficiency of digital data transmission is achieved by a digital receiver circuit comprising an encoder for encoding a digitized MR signal, wherein the digitized MR signal comprises one or more data packets, with each data packet being representative of a portion of an MR signal, and wherein the encoder is configured to dynamically allocate a number of bits for each data packet based on a characteristic of at least the portion of the MR signal represented by the particular data packet.

An MR signal, when digitized, is represented by a series of digital bits. A collection of these bits may be called a data packet, and each data packet would then digitally represent a portion of the MR signal. When a digital receiver circuit uses a fixed-point data representation to represent the digitized MR signal, each data packet of the digitized MR signal contains the same number of bits. This means that, during transmission over a network, the same number of bits must be transmitted regardless of the nature of the represented MR signal. On the other hand, if a variable-point representation is adopted, wherein the number of bits used to make up a particular data packet is based on a characteristic of at least the portion of the MR signal represented by the particular data packet, then a data packet with a smaller value for the characteristic can contain fewer number of bits compared to a data packet with a larger value for the characteristic. Thus, the total number of bits used to represent the MR signal is reduced, leading to improved efficiency in transmitting the digitized MR signal. Examples of characteristics that might be used to determine the number of bits in a data packet include the amplitude, bandwidth and signal-to-noise ratio (SNR) of the MR signal.

In correspondence with the disclosed digital receiver circuit including the encoder, a method of encoding a digitized MR signal that results in improved efficiency of digital data transmission is also disclosed herein. The method involves encoding a digitized MR signal comprising one or more data packets, wherein each data packet represents a portion of an MR signal. The method involves a step of dynamically allocating a number of bits for each data packet based on a characteristic of at least the portion of the MR signal represented by the particular data packet.

Furthermore, an MR system including a digital receiver circuit as disclosed herein, as well as a computer program for operating such a digital receiver circuit according to the disclosed method, is also disclosed herein. The MR system, including the digital receiver circuit, comprises an encoder for encoding a digitized MR signal, wherein the digitized MR signal comprises one or more data packets, with each data packet being representative of a portion of an MR signal, and wherein the encoder is configured to dynamically allocate a number of bits for each data packet based on a characteristic of at least the portion of the MR signal represented by the particular data packet. The computer program comprises instructions for encoding a digitized MR signal according to the disclosed method, wherein the digitized MR signal comprises one or more data packets, with each data packet being representative of a portion of an MR signal. The computer program includes instructions to enable a digital receiver circuit comprising an encoder to dynamically allocate a number of bits for each data packet based on a characteristic of at least the portion of the MR signal represented by the particular data packet.

BRIEF DESCRIPTION OF THE DRAWINGS

These and other aspects will be described in detail hereinafter, by way of example, on the basis of the following embodiments, with reference to the accompanying drawings, wherein.

DETAILED DESCRIPTION OF EMBODIMENTS

According to the methods disclosed herein, reduction of network bandwidth by data encoding is based on a priori knowledge of the properties of the MR signal as explained below. The reduction in network bandwidth so obtained results in increased efficiency of transmission of the digitized MR signal. MR signals are often phase encoded; when the spins are in phase, the signal level from the region of interest is high; when the spins are out of phase, the signal level is low, with the low signal level being dominated by noise. High-bandwidth signals will only be in phase for a relatively short period of time since, due to the high bandwidth, the spins will dephase rapidly. Conversely, low-bandwidth signals will be in phase for a longer period of time. An MR system including a digital receiver circuit as disclosed herein therefore generally need only be capable of receiving high-bandwidth signals with relatively low average signal level or low-bandwidth signals with relatively high average signal level but rarely, in practice, high-bandwidth signals with high average signal levels. The required sustained bandwidth of the digital network is therefore proportional to the product of $BW_{max}$ and $S_{avg}$ where $BW_{max}$ is the maximum bandwidth and $S_{avg}$ is the average signal level at or near the maximum bandwidth $BW_{max}$. The average signal level $S_{avg}$ directly determines the average number of bits per sample required to represent a digitized MR signal. It is thus an insight of the inventors that using a priori knowledge of the behaviour of MR signals enables the cost-effective encoding scheme as disclosed herein.

Figure 1:
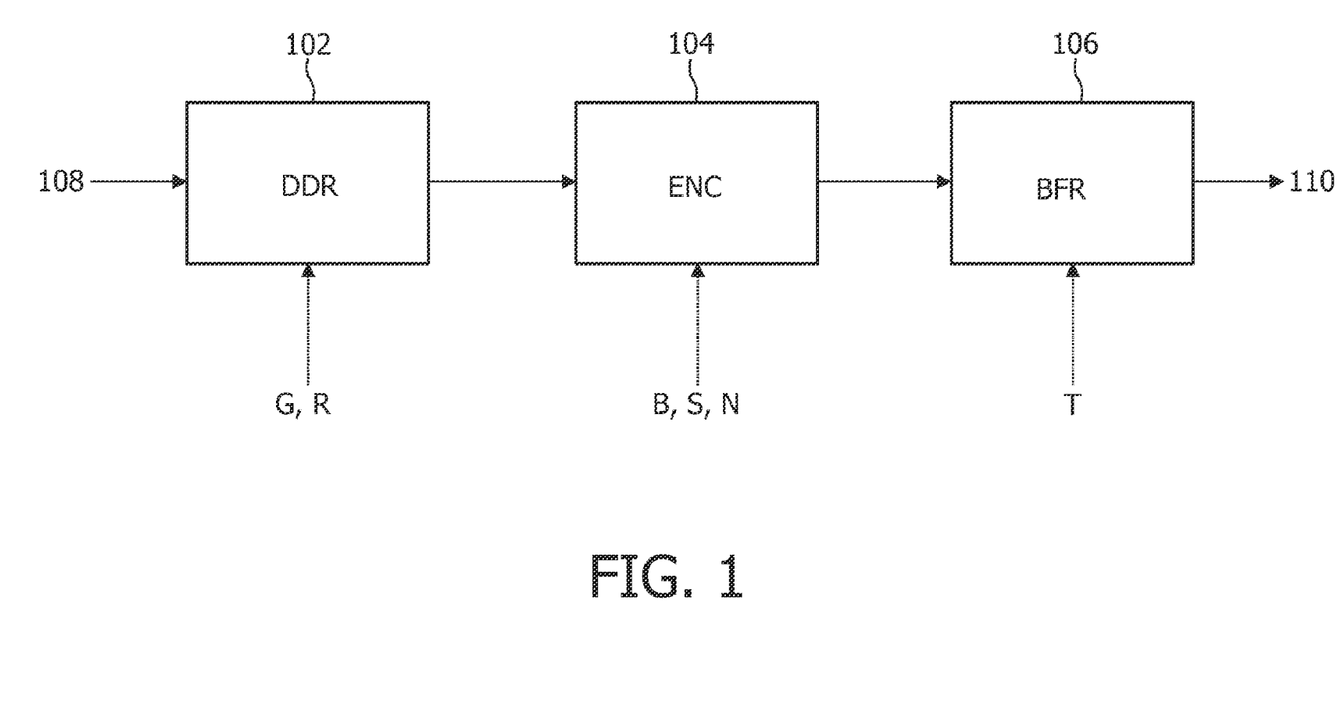
FIG. 1 schematically shows a possible implementation of a digital receiver circuit comprising an encoder circuit.

FIG. 1 shows a possible implementation of a digital receiver circuit consisting of a direct digital receiver (DDR) 102, an encoder 104 and a buffer 106. The DDR 102 accepts an MR signal 108 that is analog in nature, and outputs digital samples that are subsequently encoded by the encoder 104 and transferred to a buffer 106 for storage prior to transfer over a digital network 110. Inputs to the DDR 102 include an analog gain G, and a reduction factor R. Inputs to the encoder 104 include a significance value B, a scaling value S, and a number of samples in a data packet N. The buffer takes as an input the buffer size T.

Figure 2:
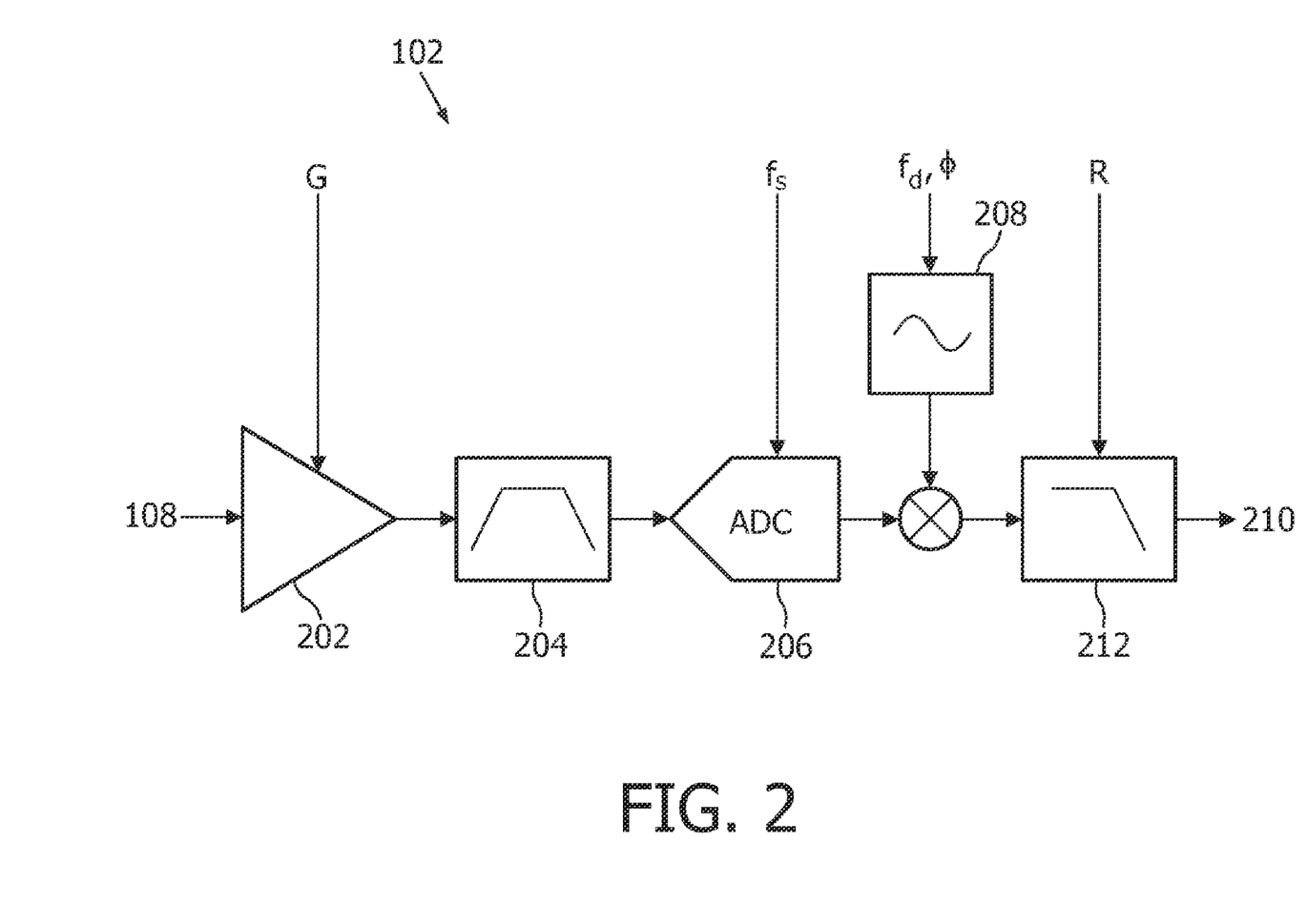
FIG. 2 schematically shows details of a possible implementation of a direct digital receiver.
Figure 6:
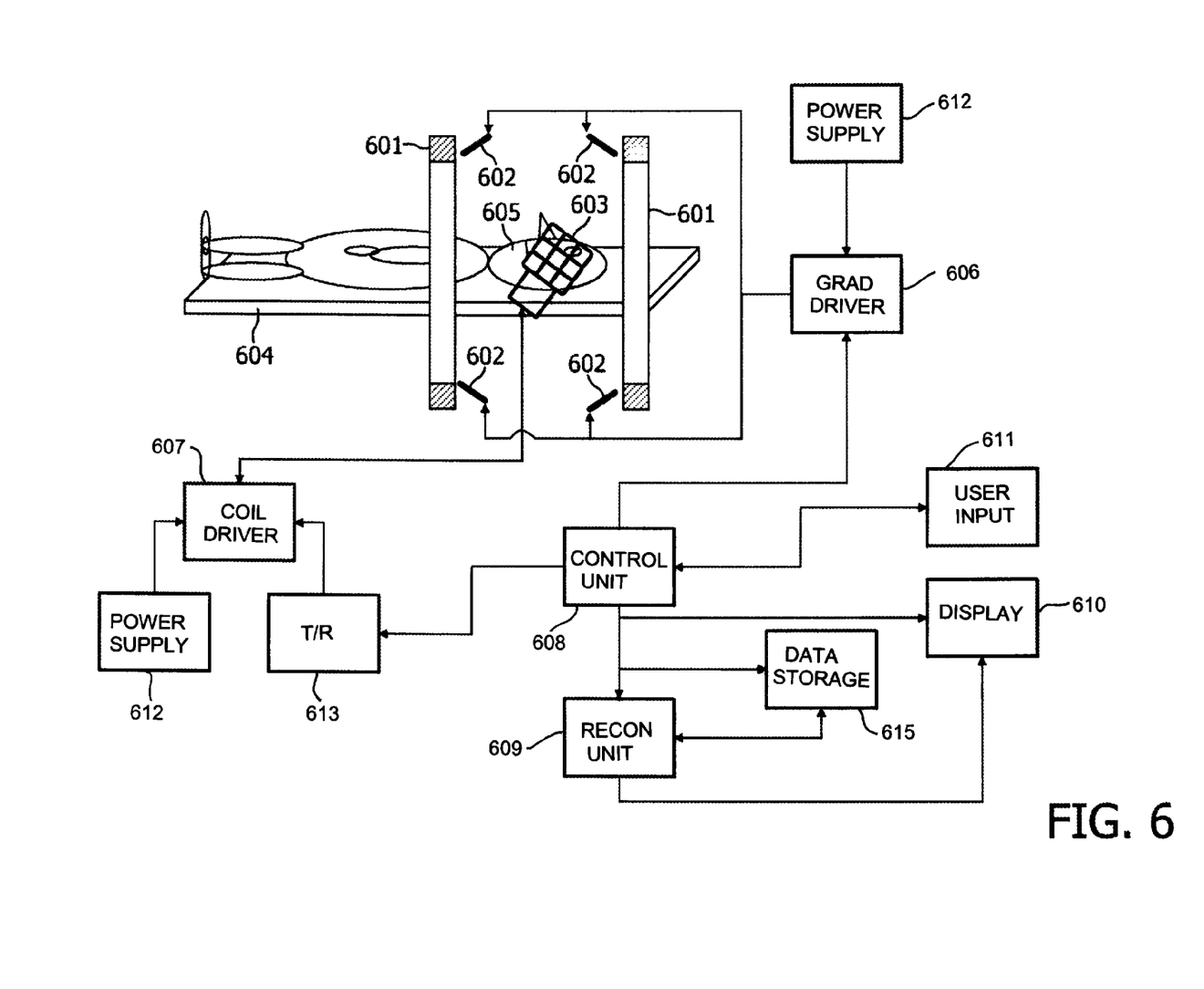
FIG. 6 schematically shows an MR system comprising an encoder as disclosed herein.

FIG. 2 schematically shows details of a possible implementation of the DDR 102, wherein an amplifier 202 receives a signal 108, for example an MR signal from a subject under examination (605 in FIG. 6). The amplifier 202 amplifies the received signal 108 based on a gain G, and outputs the amplified signal to a band-pass filter 204. The output of the band-pass filter 204 is fed to an analog-to-digital converter (ADC) 206. The ADC 206 samples the band-pass filtered signal at a sampling rate $f_s$, and outputs the digital samples to a demodulator 208. The demodulator 208 demodulates the incoming digital signal based on a demodulation frequency $f_d$ and a demodulation phase $\phi$, and a demodulated signal is output to a low-pass filter 212. The low-pass filter 212 decimates the demodulated signal based on a reduction factor R and outputs a signal 210 that is supplied to the encoder (104 in FIG. 1).

Figure 3:
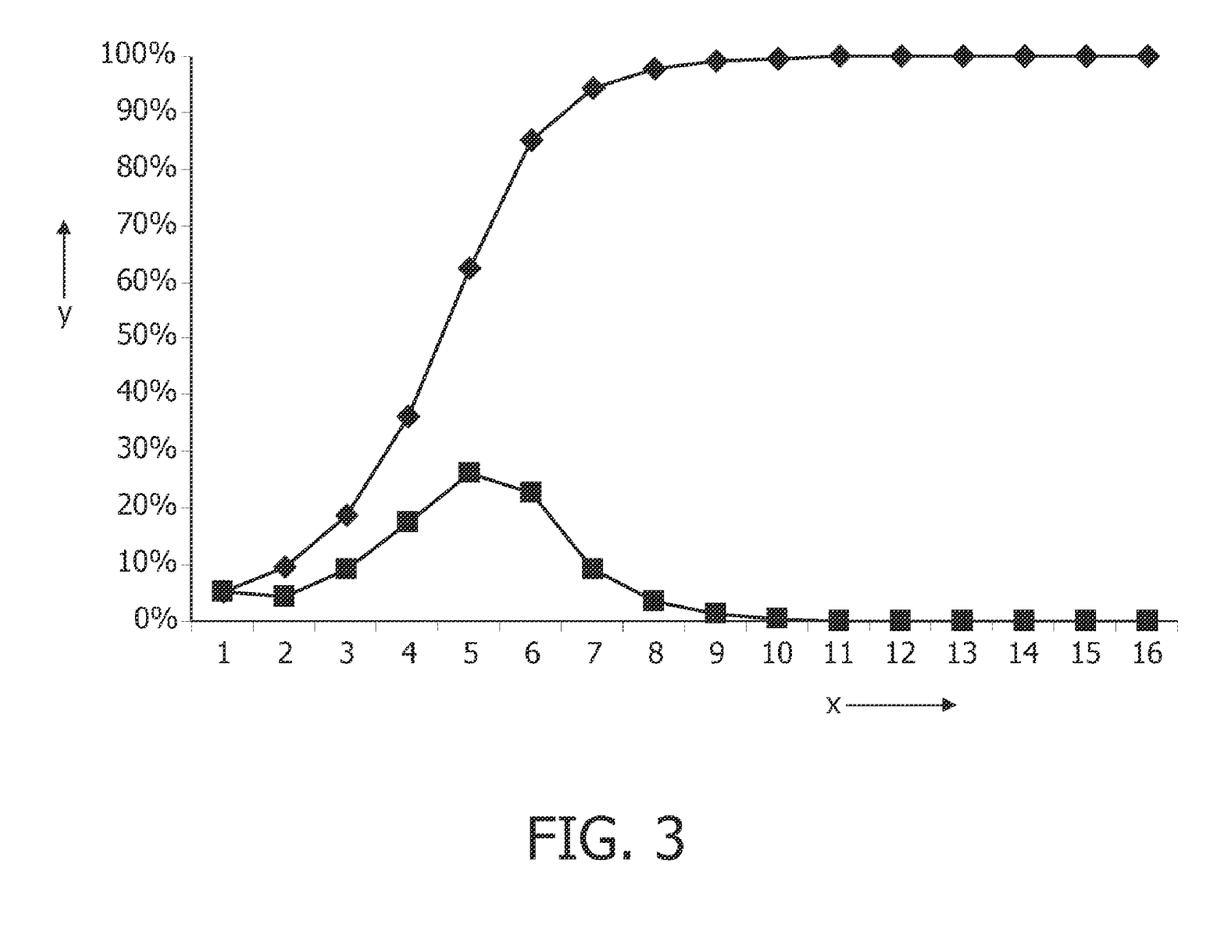
FIG. 3 shows a histogram of the number of bits required to encode a typical MR signal.

FIG. 3 shows a histogram of the number of bits required to encode a typical MR signal. In this specific case, the MR data has been acquired using a 16-bit receiver. The graph plots the bit number, shown by the x-axis, against the frequency of occurrence, shown as a percentage on the y-axis. The squares denote the actual frequency of occurrence of the bits in the sampled MR signal, while the diamonds denote the cumulative frequency of occurrence of the bits. As may be seen from the specific example of FIG. 3, 99% of the acquired sample values can be represented using 8 bits or less. Thus, by simply encoding the sample values using a variable number of bits in place of a 16-bit fixed-point representation, a loss-less compression of 50% could be achieved. In other words, if the data packet size N is chosen appropriately, loss-less encoding of the MR data may be achieved. A fixed value of 8 or 16 bits is most likely sufficient for the packet size N.

In its basic form, a data encoding technique needs to determine the number of bits required to represent integer sample values. On the decoding side, the decoder needs to know how many bits are actually transferred per sample value. This requires also transferring information about the number of bits used in the encoding to the decoder. To minimize this additional overhead, the signal is encoded in data packets in which all sample values are encoded with the same number of bits; the number of bits for a data packet being set to the maximum number of bits required for the sample values in the data packet. The number of encoded bits need then only be transferred once per packet of sample values. Increasing the data packet size reduces overhead but also reduces encoding efficiency since the number of bits required is a maximum and will tend to increase the average number of bits of the encoded signal values. The data packet size N is therefore a compromise between encoding overhead and reduced encoding efficiency. The data packet size also influences implementation size and receiver latency; for example, increasing data packet size increases both the implementation size and receiver latency.

Characteristics of the MR signal that might be used to determine the number of bits in a data packet include the amplitude, bandwidth and signal-to-noise ratio (SNR) of the MR signal. Of these, the amplitude of a portion of the MR signal may be used exclusively to determine the total number of bits required to represent the particular portion of the MR signal. Bandwidth and SNR, on the other hand, are likely to be derived from average properties of the entire MR signal, placing an upper limit on the number of bits per packet for all data packets of the digitized MR signal. A combination of the characteristics may also be used in determining the data packet size. For example, the upper limit determined based on the bandwidth or SNR of the MR signal represents, as it were, the value of the signal. The amplitude of a particular portion of the MR signal may then be used to further reduce the number of bits used to represent that portion of the MR signal, using fewer bits than the upper limit imposed by the bandwidth and/or SNR. It may be noted that in a multi-channel (or multi-transmit) RF system, there can be multiple MR signals, with each signal channel being allocated a unique upper limit according to the characteristics of the signal in that particular channel.

The amount of reduction in network bandwidth achievable through loss-less data encoding depends on the characteristics of the MR signal, particularly the noise level. The noise level effectively limits the minimum number of bits required to encode a sample value, while the dynamic range of the MR signal defines the maximum. The noise level limits the minimum number of bits required since even in the absence of an actual signal, the noise will need to be encoded. A high value for the DDR gain G will increase the noise level at the output of the DDR 102, thereby increasing the average number of bits required to encode the signal. On the other hand, a low DDR gain G will introduce additional quantization noise.

Though only a single ADC is shown in FIG. 2, multiple ADCs may also be used. Quadrature mode sampling is also possible, with the DDR 102 producing complex samples consisting of an I-sample (in-phase component) and a Q-sample (quadrature component). The encoder 104 encodes each sample produced by the DDR 102 with a variable number of bits depending on the actual sample characteristic, for example, its amplitude or bandwidth, and the encoder settings. Alternatively, the encoder 104 may encode a packet of samples based on a maximum of the characteristic of all the samples included in the packet of samples. Alternatively, the encoder 104 may encode a packet of samples based on an average of the characteristic of all the samples included in the packet of samples. The encoder 104 thus generates a variable bit-rate.

Typically, quantization noise is considered negligible if the noise density level applied at the input of the ADC 206 is 16 dB above the noise density generated by the ADC itself. In practice, ADCs with an effective number of bits of 1 less than their resolution (to which most modern ADCs conform), will output a noise level, calculated for the Nyquist bandwidth, of about 0.6 ADC units RMS. In short, if the noise level is controlled to within about 6 ADC units, the data encoding would require less than 3 bits. A possible implementation should be capable of a minimum bit-rate at the output of the encoder 104 of less than 4 bits per sample value, i.e., 8 bits per complex sample. If a maximum sampling frequency $f_s$ of 2

MHz is considered, the majority of acquired samples may be represented using only 8 bits or less, resulting in a channel bandwidth of 16 Mb/s.

Storing the encoded data in a buffer 106 averages the variable bit-rate. The degree of variability that the digital receiver circuit can tolerate is determined by the size of the buffer 106; the larger the buffer 106, the greater the variability in bit-rate that the digital receiver circuit can process.

The noise behavior at the output of the receiver depends on how the receiver is set for signal reception. The amplifier gain G defines the noise level at the input to the ADC. The reduction factor R defines the resulting signal bandwidth BW according to the equation $$BW = \frac{f_s}{R}$$

while the noise level (nl) at the output of the receiver is given by the equation $$nl = nl_{ADC} \times \sqrt{R}$$

where $nl_{ADC}$ is the noise level at the input to the ADC 206.

The reduction factor increases the signal level by R and the noise level by $\sqrt{R}$, thus effectively increasing the signal to noise (SNR) by $\sqrt{R}$. If the reduction factor R is varied from 25 to 100, the SNR is increased by a factor of 5 to 10 with respect to the input to the ADC. This implies that at least the 2 low-order bits (at the output of the DDR and prior to encoding) can be discarded without seriously influencing signal integrity or significantly increasing quantization noise. This has an impact on data encoding performance. For instance, the noise level at the output of the DDR can be encoded using 7 bits; discarding the low-order 2 bits reduces the number of bits required to encode the MR signals from 7 to 5 or by about 30%.

In practice, the MR signal for a measurement is sampled in profiles, with each profile corresponding to a contiguous sampling period of the receiver. Each profile consists of a possibly variable number of data packets for encoding and digital transport purposes. A particular data packet of the MR signal could consist of a single sample representing a very small fraction of the MR signal. Alternatively, a data packet could consist of multiple samples representing a longer period of the MR signal. In some MR acquisition strategies, the actual signal behavior for individual profiles varies depending on the specific phase encoding strategy applied during the acquisition. These properties influence the number of bits required to encode the data packets in the particular profile. For Cartesian sampling strategies, the profiles that pass through the phase encoding origin (i.e., center line of k-space) have the maximum signal strength and thus the largest encoded size. Examples of Cartesian sampling strategies include spin-echo sequences and gradient-echo sequences, which sample one line of k-space during one repetition time (TR) of an MR pulse sequence. Thus each profile in such cases consists of one line of k-space. Other sampling strategies include segmented or multi-shot echo-planar-imaging (EPI) schemes, in which multiple k-space lines are collected during a single TR. In such cases, a profile consists of multiple lines of k-space. In the case of ultra-fast imaging techniques like single-shot fast spin-echo (SSFSE) or single-shot EPI sequences, the entire k-space is covered in a single TR, and a profile, therefore consists of all lines in k-space. For radial sampling techniques, all profiles effectively pass through the origin and may be represented using the same number of bits. For spiral sampling techniques, all profiles also behave similarly but a larger succession of samples is taken near or at the origin than with Cartesian or radial sampling schemes.

For a typical MR signal, it is likely that only a fraction of samples have a high signal value. However, if samples with high signal values are taken for a prolonged period of time, then the output bit-rate of the data encoder 104 may temporarily exceed the allocated channel bandwidth even if the average bit-rate is well within the allocated channel bandwidth. The size of the buffer 106 must therefore be chosen to be able to temporarily store sufficient data to match the varying bit-rate of the data encoder 104 to the allocated bit-rate of the associated digital network. The estimated required buffer size depends strongly on the actual signal behavior as previously discussed. The spiral k-space trajectory is probably the most demanding strategy as it produces a large succession of samples with high signal values.

It may be noted that the DDR 102 is shown only in an exemplary embodiment in FIG. 1; the encoder operates on a digital representation of an MR signal, which can be supplied from other sources as well. Analog or digital signal processing such as filtering, demodulation and/or conversion to baseband prior to encoding may or may not be performed.

Figure 4A:
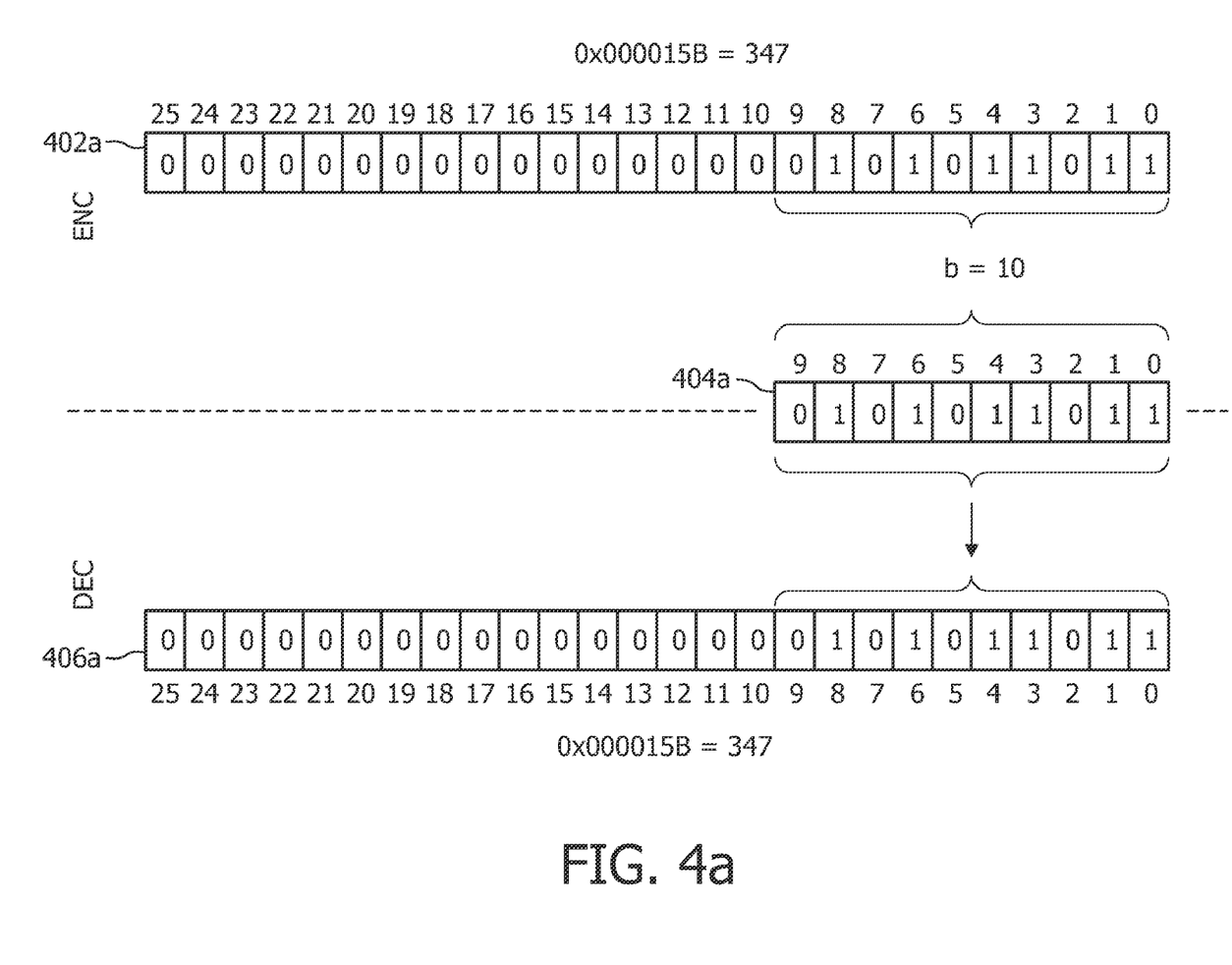
FIG. 4a shows the bit pattern in the case of a loss-less encoding scheme according to the method disclosed herein.

FIG. 4a illustrates the concept of loss-less encoding using an implementation of the method disclosed herein. Each cell in the strip of cells 402a represents one bit, with the position of the bit inside the strip or word being denoted by the number above each cell. An exemplary value of 347 is represented in binary form using a 26-bit word as 00000000000000000101011011. The bit positions represented by the smaller numbers denote the least significant bits (LSBs) of the word while those represented by the larger numbers represent the most significant bits (MSBs) of the 26-bit word. The letter b denotes the minimum number of bits required to accurately represent the value (in this case, 347). The strip of cells 402a in the section labelled ENC above the horizontal line shows the bit pattern at the input of the encoder (104 in FIG. 1), while the strip of cells 406a in the section labelled DEC below the horizontal line shows the bit pattern at the output of the decoder (not shown). The strip of cells 404a in the middle shows the compressed bit pattern at the output of the encoder (104 in FIG. 1).

If the DDR (102 in FIG. 1) outputs a 26-bit word for every sample of the MR signal, then a signal value of 347 units may be represented as shown in FIG. 4a. As may be seen, only the 10 LSBs are used to represent the integer value of 347, with the first 9 LSBs representing the integer value 347 and the $10^{th}$ least significant bit (LSB), called the sign bit, indicating the sign of the integer. If we define a significance factor B as the maximum number of bits used to encode sample values and a scaling factor S as the number of low-order bits to discard, then the bit-rate of the data encoder (104 in FIG. 1) is controlled by appropriately setting B and S. In a possible implementation, B is applied first and then S. S is less than B to ensure that at least one bit is output per sample value. For exemplary values of B=26 and S=0, loss-less data encoding will be performed. However, compared to this, using only the 10 bits as shown in FIG. 4a for representing a value of 347 units results in loss-less encoding with a reduction, in the number of bits used, of 61%.

The number of significant bits b required to encode a value may be determined during encoding. If this exceeds a set significance value B, then the low-order [b-B] bits are discarded and B bits are output; otherwise b bits are output. The significance B therefore limits the maximum number of bits output for any single encoded value.

Figure 4B:
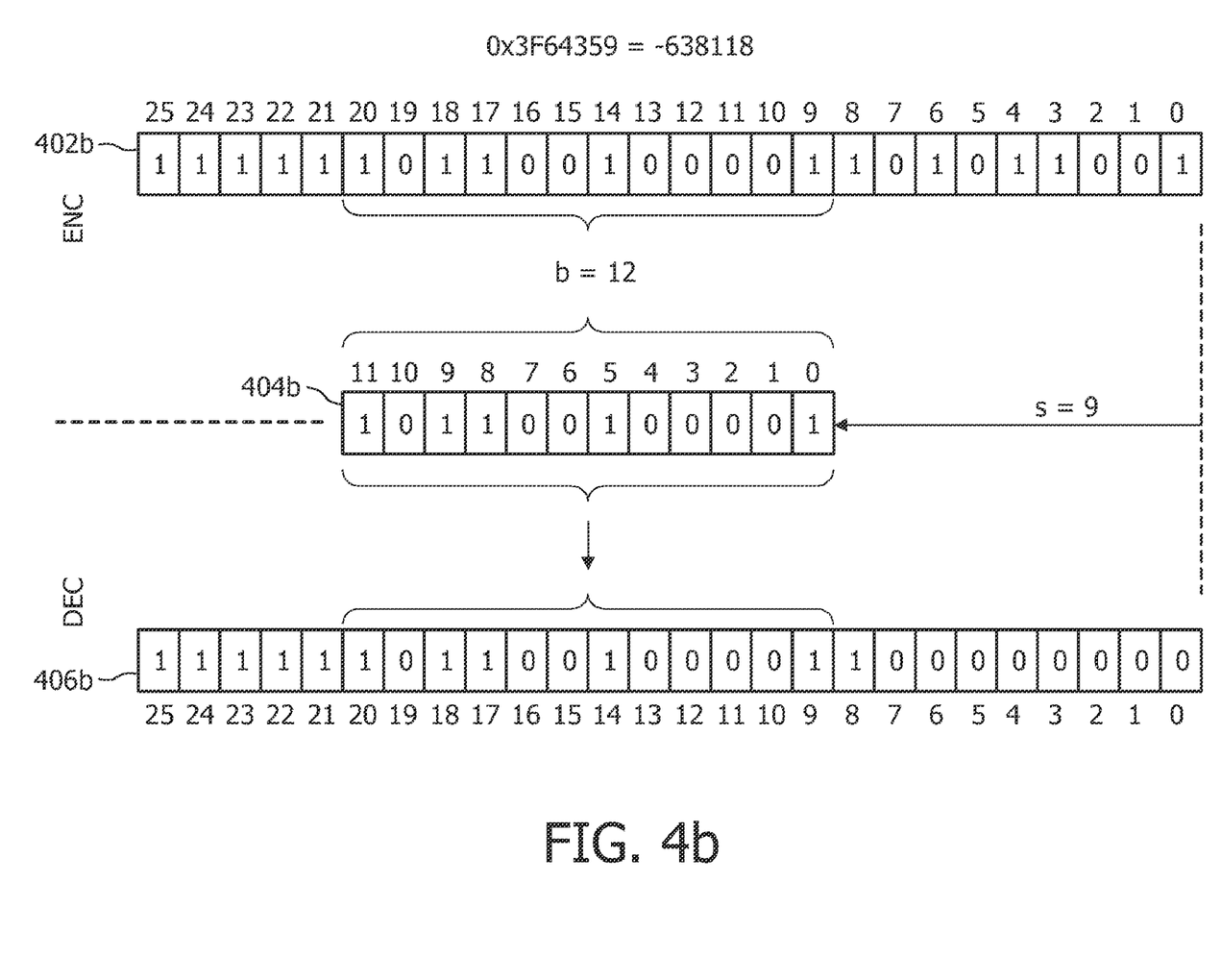
FIG. 4b shows the bit pattern in the case of a lossy encoding scheme according to the method disclosed herein.

FIG. 4b illustrates the concept of lossy encoding using an implementation of the method disclosed herein. Each cell in the strip of cells 402b represents one bit, with the position of the bit inside the strip or word being denoted by the number above each cell. An exemplary value of −638118 is represented in binary form using a 26-bit word as 11111101100100001101011001. The bit positions represented by the smaller numbers denote the LSBs of the word while those represented by the larger numbers represent MSBs of the 26-bit word. The letter b denotes the minimum number of bits required to represent the value (in this case, −638118), while the letter s denotes the number of LSBs to be discarded. The strip of cells 402b in the section labelled ENC above the horizontal line shows the bit pattern at the input of the encoder (104 in FIG. 1), while the strip of cells 406b in the section labelled DEC below the horizontal line shows the bit pattern at the output of the decoder (not shown). The strip of cells 404b in the middle shows the compressed bit pattern at the output of the encoder (104 in FIG. 1).

To fully represent a sample value of −638118, 21 bits are required. However, if the significance B is set to 12 and the scaling factor s is set to 9, then the low-order 9 bits or 9 LSBs are discarded, and only the next higher 12 bits are actually output by the encoder (104 in FIG. 1). This includes the sign bit shown in position 20. When low-order bits are truncated, a rounding bit (in this case, bit position 8 in the decoder output 406b) may be introduced during decoding to ensure that the truncated bits do not introduce a DC-offset in the decoded signal. The effective reduction in the number of bits used to represent the value −638118 is 54%.

The actual effect of B on the average bit-rate of the encoder may be marginal as it typically only has an effect on the limited fraction of samples of the MR signal that require a large number of bits to encode. B will only have an effect if it is set to a small value (i.e., approaching the average loss-less encoded bit-rate of the signal). If the bit-rate of the encoder (104 in FIG. 1) is to be reduced significantly, the bit-length needs to be scaled by setting the scaling factor S to some a value larger than zero. This has the effect of unconditionally truncating lower order bits. For example, for 2 MHz sampling at a bandwidth of 20 Mb/s, samples may be encoded with an average of $$\frac{\left(\frac{20 \text{ Mb/s}}{2 \text{ MHz}}\right)}{2} = 5 \text{ bits}$$

Considering an expected value for B of 8, the value of S should be set to 3.

The significance B may be set to guarantee that the allocated bandwidth of the digital network is not exceeded. For example, at a bandwidth of 20 Mb/s and a sample rate of 700 KHz, the transfer of 14-bits per sample value can be guaranteed. Setting B to 14 will then guarantee that the network bandwidth is not exceeded. The scaling factor S should be set when the average bit-rate of the data encoder is expected to exceed the allocated channel bandwidth. It may be noted that the allocated channel bandwidth need not be constant but may be a function of the RF coil or combination of RF coils used. For example, an 8-channel RF coil implemented with 4 channels per 250 Mb/s link can be allocated 40 Mb/s per channel.

The value of S might be determined in a dedicated preparation phase of an MR acquisition sequence wherein a reference profile is acquired to estimate the maximum size of an encoded profile. Alternatively, S might be adjusted automatically as a function of buffer filling. For example, S can be increased when the buffer (106 in FIG. 1) fills beyond some threshold level and can be decreased when the buffer-filling falls below the same or other threshold level. It may be noted that artifacts induced in images as a result of adopting such an approach are unpredictable.

Figure 5:
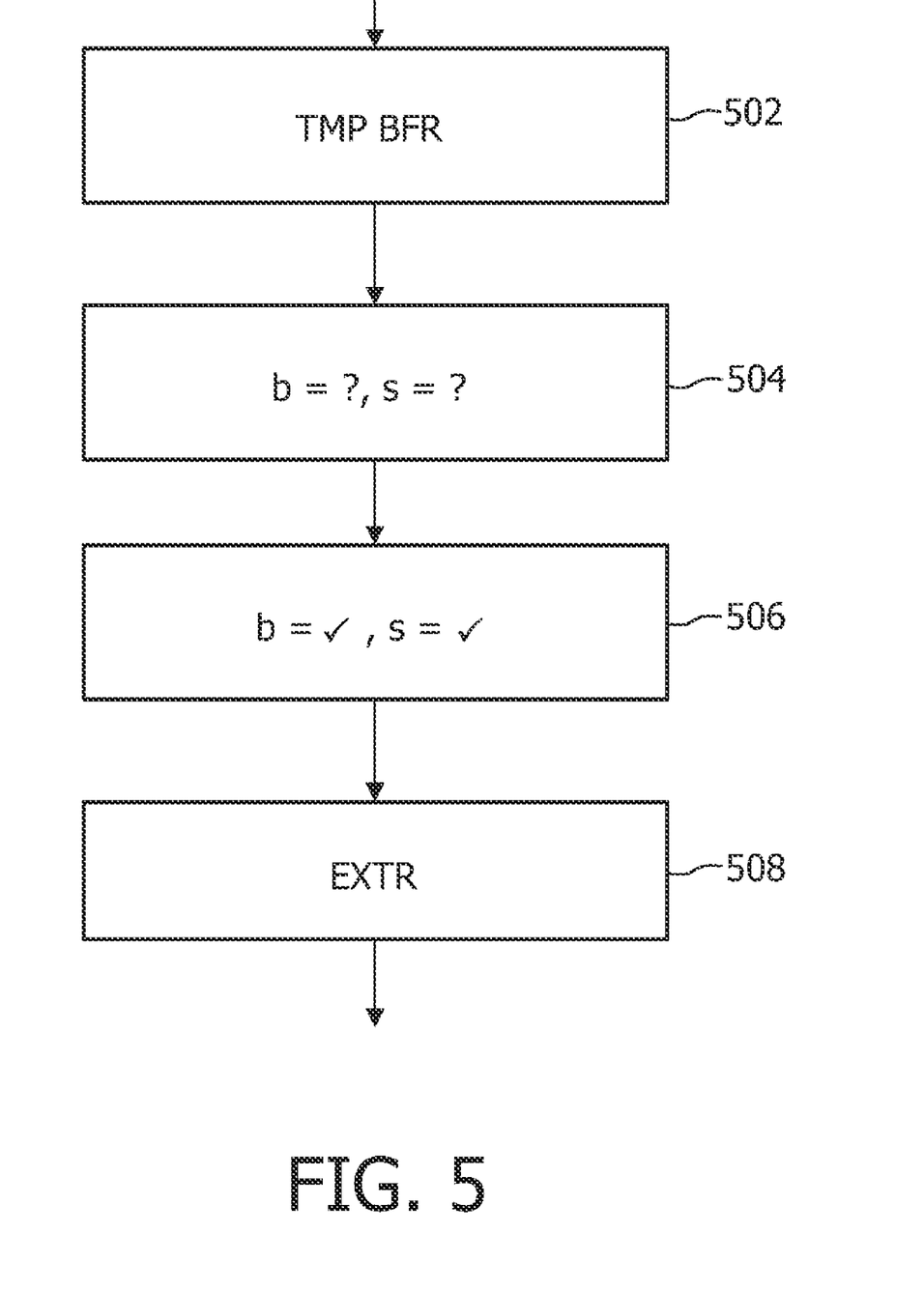
FIG. 5 diagrammatically shows a method as disclosed herein.

FIG. 5 shows a flowchart illustrating the algorithm of the method disclosed herein. A sample or number of samples is input into a temporary storage buffer in a step 502. The temporary storage buffer is internal to the encoder (104 in FIG. 1). In a step 504, the number of bits 'b' required to accurately represent the samples in the temporary storage buffer is determined. This value of 'b' is output in a step 506, and used in a step 508 to extract 'b' most significant bits of each sample. The extracted bits are output to the buffer (106 in FIG. 1) in the order originally sampled.

The number of samples that are treated simultaneously, i.e., stored in the temporary buffer in the step 502, is a parameter to the algorithm. It may even be set dynamically to optimize bandwidth. Increasing the number of bits b to a maximum value is optional.

For a case where additional compression is required at the cost of some loss in data content, the algorithm may be modified as follows:

A sample or number of samples is input into a temporary storage buffer in a step 502. The temporary storage buffer is internal to the encoder (104 in FIG. 1). In a step 504, the number of bits 'b' required to accurately represent the samples in the temporary storage buffer, as well as the scaling factor 's' which determines the number of LSBs to be truncated, is determined. The values of 'b' and 's' are output in a step 506, and used in a step 508 to extract 'b' most significant bits of each sample from the temporary storage buffer. The extracted bits are output to the buffer (106 in FIG. 1) in the ordered originally sampled.

Decoding the encoded MR signal may be achieved by "sign-extending" the variably sized values, scaling and optionally rounding them. "Sign-extending" involves padding the LSBs with zeroes and the MSBs with either a zero or a one, depending on the sign bit (bit position 9 in FIG. 4a or bit position 20 in FIG. 4b). Furthermore, it may be appropriate and more efficient to integrate decoding with a conversion to a floating-point representation of the decoded signal.

FIG. 6 shows a possible embodiment of an MR system utilizing the disclosed digital receiver circuit. The MR system comprises a set of main coils 601, multiple gradient coils 602 connected to a gradient driver unit 606, and RF coils 603 connected to an RF coil driver unit 607. The function of the RF coils 603, which may be integrated into the magnet in the form of a body coil, and/or may be separate surface coils, might further be controlled by one or more transmit/receive (T/R) switches 613. The multiple gradient coils 602 and the RF coils 603 are powered by a power supply unit 612. A transport system 604, for example a patient table, is used to position a subject 605, for example a patient, within the MR imaging system. A control unit 608 controls the RF coils 603 and the gradient coils 602. The control unit 608 further controls the operation of a reconstruction unit 609. The control unit 608 also controls a display unit 610, for example a monitor screen or a projector, a data storage unit 615, and a user input interface unit 611, for example, a keyboard, a mouse, a trackball, etc.

The main coils 601 generate a steady and uniform static magnetic field, for example, of field strength 1.0 T, 1.5 T or 3 T. The disclosed methods and devices are applicable to other field strengths as well. The main coils 601 are arranged in such a way that they typically enclose a tunnel-shaped examination space, into which the subject 605 may be introduced. Another common configuration comprises opposing pole faces with an air gap in between them into which the subject 605 may be introduced by using the transport system 604. To enable MR imaging, temporally variable magnetic field gradients superimposed on the static magnetic field are generated by the multiple gradient coils 602 in response to currents supplied by the gradient driver unit 606. The power supply unit 612, fitted with electronic gradient amplification circuits, supplies currents to the multiple gradient coils 602, as a result of which gradient pulses (also called gradient pulse waveforms) are generated. The control unit 608 controls the characteristics of the currents, notably their strengths, durations and directions, flowing through the gradient coils to create the appropriate gradient waveforms. The RF coils 603 generate RF excitation pulses in the subject 605 and receive MR signals generated by the subject 605 in response to the RF excitation pulses. The RF coil driver unit 607 supplies current to the RF coil 603 to transmit the RF excitation pulses, and amplifies the MR signals received by the RF coil 603. The transmitting and receiving functions of the RF coil 603 or set of RF coils are controlled by the control unit 608 via the T/R switch 613. The T/R switch 613 is provided with electronic circuitry that switches the RF coil 603 between transmit and receive modes, and protects the RF coil 603 and other associated electronic circuitry against breakthrough or other overloads, etc. The characteristics of the transmitted RF excitation pulses, notably their strength and duration, are controlled by the control unit 608.

It is to be noted that though the transmitting and receiving RF coil are shown as one unit in this embodiment, it is also possible to have separate coils for transmission and reception, respectively. It is further possible to have multiple RF coils 603 for transmitting or receiving or both. The RF coils 603 may be integrated into the magnet in the form of a body coil, or may be separate surface coils. They may have different geometries, for example, a birdcage configuration or a simple loop configuration, etc. The control unit 608 is preferably in the form of a computer that includes a processor, for example a microprocessor. The control unit 608 controls, via the T/R switch 613, the application of RF pulse excitations and the reception of MR signals comprising echoes, free induction decays, etc. User input interface devices 611 like a keyboard, mouse, touch-sensitive screen, trackball, etc., enable an operator to interact with the MR system. The MR signal received with the RF coils 603 contains the actual information concerning the local spin densities in a region of interest of the subject 605 being imaged. The received signals are reconstructed by the reconstruction unit 609, and displayed on the display unit 610 as an MR image or an MR spectrum. It is alternatively possible to store the signal from the reconstruction unit 609 in a storage unit 615, while awaiting further processing. The reconstruction unit 609 is constructed advantageously as a digital image-processing unit that is programmed to derive the MR signals received from the RF coils 603.

The MR signal received by the RF coil 603 forms the input (108 in FIGS. 1 and 2) to the digital receiver circuit disclosed herein, and more specifically, to the DDR (102 in FIGS. 1 and 2) in the digital receiver circuit. The DDR samples and demodulates the MR signal. This sampled and demodulated signal is supplied to the encoder (104 in FIG. 1), which encodes the signal in either a loss-less or lossy manner, depending on the choice of a significance value B and a scaling factor S. The output of the encoder is stored in a buffer (106 in FIG. 1) before being transferred as a digital signal (110 in FIG. 1) over a digital network.

The methods disclosed herein may be implemented in hardware in the form of a low-cost and low-power application-specific integrated circuit (ASIC). Alternatively, the methods disclosed herein may be implemented in software as a computer program that enables an encoder (104 in FIG. 1) to dynamically allocate a number of bits for each data packet based on a characteristic of at least the portion of the magnetic resonance signal represented by the particular data packet.

The order in the described embodiments of the disclosed devices or the described implementations of the disclosed methods is not mandatory. A person skilled in the art may change the order of steps or perform steps concurrently using threading models, multi-processor systems or multiple processes without departing from the disclosed concepts.

The computer program disclosed herein may reside on a computer readable medium, for example a CD-ROM, a DVD, a floppy disk, a memory stick, a magnetic tape, or any other tangible medium that is readable by a computer. The computer program may also be a downloadable program that is downloaded, or otherwise transferred to the computer, for example via the Internet. The computer program may be transferred to the computer via a transfer means such as an optical drive, a magnetic tape drive, a floppy drive, a USB or other computer port, an Ethernet port, etc.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The disclosed methods can be implemented by means of hardware comprising several distinct elements, and by means of a suitably programmed computer. In the system claims enumerating several means, several of these means can be embodied by one and the same item of computer readable software or hardware. The mere fact that certain measures are recited in mutually different dependent claims does not indicate that a combination of these measures cannot be used to advantage.

The invention claimed is:

1. A magnetic resonance coil assembly, comprising:
a main magnet which generates a uniform magnetic field through an examination region:
a radio-frequency coil element configured to receive an analog magnetic resonance from a subject under examination;
a sampling circuit radio frequency coil element the sampling circuit sampling the analog magnetic resonance signal creating a digital magnetic resonance signal;
an encoder connected sampling circuit, the encoder forming the digital magnetic resonance signal into a series of data packets, dynamically allocating a number of bits in each data packet been based on a characteristic of at least a portion of the digital magnetic resonance signal represented by each data packet;
wherein the characteristic of the at least a portion of the digital magnetic resonance signal represented by each data packet, which determines the number of dynamically allocated bits includes at least one, or more of the characteristics of:
the portion amplitude,
the portion bandwidth, and
the signal-to-noise ratio (SNR) of the portion;
a reconstruction processor which reconstructs the digital magnetic resonance signal data packets into an image; and, a display device on which the reconstructed image is displayed.

2. The magnetic resonance coil assembly according to claim 1, wherein the characteristic of at least the digital magnetic resonance signal, which determines the number of dynamically allocated bits is its amplitude.

3. The magnetic resonance coil assembly according to claim 1, wherein the characteristic of at least the digital magnetic resonance signal, which determines the number of dynamically allocated bits is its bandwidth.

4. The magnetic resonance coil assembly according to claim 1, wherein the characteristic of at least the digital magnetic resonance signal, which determines the number of dynamically allocated bits is its signal-to-noise ratio (SNR).

5. The magnetic resonance coil assembly according to claim 1, wherein the dynamically allocated number of bits for each data packet is allocated based on a maximum value of the at least one characteristic of at least the digital magnetic resonance signal represented by the particular data packet;
    wherein the maximum value of the at least one characteristic of the digital magnetic resonance signal represented by each data packet, includes at least one, or more of the characteristics of:
        the maximum value of the amplitude,
        the maximum value of the bandwidth, and
        the maximum value of the signal-to-noise ratio (SNR).

6. A method of digitizing an analog magnetic resonance signal, the method comprising:
    receiving the analog magnetic resonance signal from a coil element;
    sampling the analog magnetic resonance signal in portions in order to form a digital magnetic resonance signal including a plurality of bits corresponding to each sampled portion of the analog magnetic resonance signal;
    forming a data packet from the bits corresponding to each sampled portion of the analog magnetic resonance signal including dynamically allocating a number of bits for each data packet based on a characteristic of at least a sampled portion of the magnetic resonance signal represented by a particular data packet;
    wherein the characteristic of the at least a portion of the digital magnetic resonance signal represented by each data packet, which determines the number of dynamically allocated bits includes at least one, or more of the characteristics of:
        the sampled portion amplitude,
        the sampled portion bandwidth, and
        the signal-to-noise ratio (SNR) of the sampled portion.

7. A non-transitory computer-readable medium carrying a program, which controls one or more processors in order to perform the method of digitizing according to claim 6.

8. The method according to claim 6, further including:
    reconstructing one or more of the formed data packets into a digitized magnetic resonance image.

9. The method according to claim 8, further including: displaying the digitized magnetic resonance image on a display device.

10. A magnetic resonance system, comprising:
    a main magnet which generates a uniform magnetic field through at least a portion of a subject;
    an RF coil disposed adjacent to the subject configured to receive an analog magnetic resonance signal;
    a digital receiver circuit, which receives the analog magnetic resonance signal from the RF coil and digitizes the analog magnetic resonance signal into a digital magnetic resonance signal including a plurality of data packets, each data packet corresponding to a sampled portion of the analog magnetic resonance signal and having a variable number of bits based on a characteristic of the corresponding sampled portion;
    wherein the characteristic of the corresponding sampled portion of the digital magnetic resonance signal represented by each data packet, which determines the number of variable bits includes at least one, or more of the characteristics of:
        corresponding sampled portion amplitude,
        corresponding sampled portion bandwidth, and
        corresponding signal-to-noise ratio (SNR) of the sampled portion;
    a processor which processes the plurality of data packets into digital magnetic resonance information; and
    a memory which stores the digital magnetic resonance information.

11. The magnetic resonance system according to claim 10, wherein the processor reconstructs the plurality of data packets into a digital magnetic image.

12. The magnetic resonance system according to claim 10, wherein the digital receiver circuit includes:
    an analog-to-digital converter, which samples the analog magnetic resonance signal with a sampling frequency; and
    a demodulator which demodulates the digital resonance signal from the analog-to-digital converter with a demodulation frequency and a demodulation phase.

13. The magnetic resonance system according to claim 11, wherein the digital receiver circuit samples the analog magnetic resonance signal in profiles, with each profile corresponding to a line of K-space that is utilized by the processing and reconstruction components.

* * * * *